United States Patent [19]

Kuroda et al.

[11] Patent Number: 5,459,093
[45] Date of Patent: Oct. 17, 1995

[54] METHOD FOR FORMING DUMMY PATTERN IN A SEMICONDUCTOR DEVICE

[75] Inventors: Hideaki Kuroda; Keiichi Ono, both of Kanagawa, Japan

[73] Assignee: Sony Corporation, Tokyo, Japan

[21] Appl. No.: 214,141

[22] Filed: Mar. 17, 1994

[30] Foreign Application Priority Data

Mar. 18, 1993 [JP] Japan .................................. 5-085639
May 28, 1993 [JP] Japan .................................. 5-151143

[51] Int. Cl.⁶ .................................. H01L 21/70; H01L 27/00
[52] U.S. Cl. .................................. 437/51; 437/250; 437/195; 364/488; 364/491
[58] Field of Search .................................. 437/51, 250; 257/206, 257/208, 210–211; 364/488, 491; 307/303.1, 303.2, 303, 465.1

[56] References Cited

U.S. PATENT DOCUMENTS 5,032,890  7/1991  Ushiku et al. .................................. 257/211
5,278,105  1/1994  Eden et al. .................................. 437/250

Primary Examiner—Olik Chaudhuri
Assistant Examiner—H. Jey Tsai
Attorney, Agent, or Firm—Hill, Steadman & Simpson

[57] ABSTRACT

Method of forming a dummy pattern without inducing crosstalk between conductive interconnects which would normally be caused by increase in capacitance between the interconnects. Also, absolute steps of devices are made uniform. Furthermore, the flatness of devices is improved. In a device having a multilayer aluminum metallization structure, let Chip be data about a region on which a dummy pattern should be defined. Let $I_{Mi}$ be data about a region occupied by an aluminum interconnect pattern on the ith layer. Let $I_{Di}$ be data about a dummy pattern on the ith layer, or data sought for. Let $(Chip-I_{Mi})_D$ be data about the dummy pattern region obtained by decrement of data. The data $(Chip-I_{Mi})_D$ about the dummy pattern region is ANDed with data $I_{M(i+1)}$ about the conduction pattern on the (i+1)th layer or with data $I_{D(i+1)}$ about the dummy pattern. Thus, data $I_{Di}$ about the dummy pattern is created. The dummy pattern on the ith layer is created, based on the created data $I_{Di}$.

8 Claims, 10 Drawing Sheets

(related art)

(related art)

METHOD FOR FORMING DUMMY PATTERN IN A SEMICONDUCTOR DEVICE

BACKGROUND OF THE INVENTION

1. Field of the Invention

The present invention relates to a method for forming a dummy pattern and, more particularly, to a method for forming a dummy pattern in a semiconductor device having a multilayer metallization structure.

2. Description of the Related Art

As the densities of LSIs are increased, more devices, especially conducting metallization, are formed as multilayer structures. Therefore, the absolute steps in devices between portions where conductive interconnect patterns exist and portions where no conductive interconnect pattern exist are increased with each year.

In order to photolithographically pattern metallizations located at different heights to form conductive interconnects, it is necessary to secure a margin for the depth of focus. However, the depth of focus and the resolution have a conflicting relationship and so limitations are imposed on thinning of conductive interconnects of multilayer metallization structure.

In an attempt to solve this problem, methods consisting of forming a dummy pattern in a location where no conductive interconnect pattern exists so as to make uniform absolute steps on devices have been proposed. Generally, two methods are known as these methods. In one method (1), if conductive interconnects run on a grid as in a gate array, a dummy pattern consisting of hatched portions in FIG. 1A is created on the grid G consisting of a pattern of small islands. In the other method (2), a dummy pattern indicated by the hatched portion in FIG. 1B is so formed that it covers the whole area where no conductive interconnects exist and that the dummy pattern is at some distance S from the conductive interconnect pattern.

However, the former method (1) is applied to patterns consisting of interconnects arranged regularly such as gate arrays. Therefore, this method cannot be applied to patterns consisting of conductive interconnects arranged irregularly. In the latter method (2), a conductive interconnect pattern of a large area exists and so stress is concentrated in the pattern, thus causing an explosion. Also, the capacitance between adjacent conductive interconnects increases, resulting in crosstalk between them.

Referring to FIG. 2, let $I_1, I_2, \ldots, I_7$ be Al interconnects. Let $C_0$ be the capacitance of the bottoms of the interconnects. Let $C_1$ be the capacitance of the side surfaces of the interconnects. The capacitance Ca between the adjacent interconnects $I_1$ and $I_2$ is given by $Ca \neq C_1 + C_0/2$. The capacitance Cb between the adjacent conductive interconnects $I_1$ and $I_7$ is given by $Cb \neq C_0/2$. Thus, capacitances between conductive interconnects which are remote from each other such as between $I_1$ and $I_7$ cannot be neglected.

A combination of the methods (1) and (2) described above may be contemplated. In this case, arithmetic operations at the boundary between a dummy pattern and a conductive interconnect pattern are necessary. Also, it is necessary to perform a design rule check. In this way, the arithmetic operations performed during automatic pattern creation are too complex.

Where contact holes for connecting a conductive interconnect pattern on an upper layer with a conductive interconnect pattern on a lower layer are formed, an absolute step h is created across the interlayer film due to a device step formed by the presence and absence of conductive interconnect pattern, as shown in FIG. 3A. Therefore, if the depth of focus is varied and an exposure operation is performed when contact holes are created, the holes vary in diameter because the thickness of the photoresist is not uniform.

Depending on the process for flattening the interlayer film, the interlayer film in which contact holes are formed may have different thicknesses such as $h_1$ and $h_2$ in different locations, as shown in FIG. 3B.

In this case, the interlayer film having nonuniform thickness is subjected to reactive ion etching (RIE) and so contact holes formed in thin portions of the interlayer film are overetched. Consequently, the underlying aluminum layer is etched, and a compound of the aluminum and the photoresist adheres to the side wall of the photoresist. After removal of the photoresist, the compound is left behind, resulting in so-called crown. This will hinder burying the contact holes.

SUMMARY OF THE INVENTION

It is an object of the present invention to provide a method for forming a dummy pattern in such a way that a uniform absolute device step is provided without inducing crosstalk between conductive interconnects which would normally be caused by increases in the capacitance between the interconnects, and that the flatness of the device surface can be enhanced.

It is another object of the invention to provide a method for forming a dummy pattern in such a way that variations in the diameters of contact holes can be suppressed and that generation of the aforementioned crown can be prevented.

The above objects are achieved by a method of forming a dummy pattern in a semiconductor device having n layers of metallization (n is an integer equal to or greater than 2) according to the invention. When the dummy pattern is formed on the ith (i is an integer and satisfies the relation $1 \leq i < n$) layer, data about this dummy pattern is created, using data about a conductive interconnect pattern or a dummy pattern on the (i+1)th layer. Then the dummy pattern on the ith layer is created, based on this data.

In one feature of the invention, the conductive interconnect pattern or dummy pattern on the ith layer is formed in a region wider than the region in which the conductive interconnect pattern or dummy pattern on the (i+1)th layer is formed.

In another method of forming a dummy pattern according to the invention, data about a dummy pattern on the ith layer is created from data about conductive interconnect patterns on both the (i+1)th and (i−1)th layers when the dummy pattern on the ith layer ($2 \leq i < n$) should be formed. Then, this dummy pattern is created, based on the data. This data about the dummy pattern is created by taking the AND of first data, second data, third data, and fourth data. The first data is obtained by taking the AND of data about a dummy pattern region and data about conductive interconnect patterns on both (i+1)th and (i−1)th layers, the dummy pattern region being equal to the difference between a region in which the dummy pattern should be formed and the conductive interconnect pattern region on the ith layer. The second data is obtained by taking the AND of data about a first region and the data about the conductive interconnect pattern on the (i+1)th layer, the first region being equal to the difference between the dummy pattern region and a region defined by the first data. The third data is obtained by taking the AND of data about a second region and the data about the conductive interconnect pattern on the (i−1)th layer, the second region being equal to the dummy pattern region minus regions defined by the first and second data. The fourth data indicates a region which is the equal to the dummy pattern region minus regions defined by the first, second, and third data.

Also, the data about the dummy pattern is created by subtracting the first, second, and third data from the data about the dummy pattern region. The first data is obtained by taking the AND of the data about the dummy pattern region and the data about the conductive interconnect pattern on both (i+1)th and (i−1)th layers. The second data is obtained by taking the AND of the data about the first region and the data about the conductive interconnect pattern on the (i+1)th layer, the first region being equal to the difference between the dummy pattern region and the region defined by the first data. The third data is obtained by taking the AND of the data about the second region and the data about the conductive interconnect pattern on the (i−1)th layer, the second region being equal to the dummy pattern region minus the regions defined by the first and second data.

A further method of forming a dummy pattern according to the invention is carried out in the manner described now. When a dummy pattern should be formed on the ith layer, data about a two-dimensional array of islands each consisting of an assemblage of polygons is prepared. Data about the conductive interconnect pattern on the ith layer is created by performing logical operations on the data about features or a figure of the two-dimensional array of islands and on data about the pattern of conductive interconnects on the ith layer. The dummy pattern is created from the data about the pattern of the conductive interconnects.

Where the polygons are squares and the length L of each side of the squares satisfies the design rule for the conductive interconnects, the spacing S between the adjacent islands is so set that the relation 2L< S is met.

A yet other method of forming a dummy pattern according to the invention is carried out in the manner described now. When a dummy pattern should be created on the ith layer (1≠i< n−1), data about the dummy pattern on the ith layer is created, using data about contact regions on the (i+2)th through nth layers. The dummy pattern is formed, based on the data about the dummy pattern on the ith layer.

Fourth data is used as data about this dummy pattern. Third data is obtained by subtracting second data from first data. A first region is defined by the AND of data about the contact regions on the (i+2)th through nth layers. The first data defines a second region which is obtained by enlarging the first region by a given amount. A third region is defined by data about the conductive interconnect pattern on the ith layer. The second data defines a fourth region which is obtained by enlarging the second region by a certain amount. The third data defines a fifth region. The fourth data defines a region which is obtained by reducing a portion of the fifth region by a given amount and enlarging the remaining portion by the same amount.

When a dummy pattern is created on some layer, data about patterns or features is arithmetically processed, using data about the pattern of conductive interconnects or a dummy pattern on the upper layer. Thus, data about the dummy pattern is found. This dummy pattern is created in a certain region, excluding the region where the conductive interconnects are formed, and under the conductive interconnects or dummy pattern on the upper layer. As a result, the absolute step on the device surface is reduced.

Preferably, the dummy pattern is created in a region wider than the region where the conductive interconnects or dummy pattern on the upper layer is formed. This makes mild the slope at the boundary between the close conductive interconnect region and the coarse conductive interconnect region. Also, the local step at this boundary is reduced.

When a dummy pattern is created on some layer, the pattern of the conductive interconnects on the lower layer is taken into account, as well as the pattern of conductive interconnects on the upper layer. The data about the patterns or features are arithmetically processed, using data about the patterns on the upper and lower layers. In this way, data about the desired dummy pattern is obtained.

In a certain region excluding the region where conductive interconnects are formed, dummy patterns are formed under the conductive interconnects on the upper layer and also in portions of other regions, or dummy interconnects are formed in other regions excluding under the conductive interconnects on the upper layer.

In consequence, the crosstalk between conductive interconnects due to increases in the capacitances between the interconnects is prevented. Normally, such crosstalk would be caused when a dummy pattern is formed over a whole certain region excluding the region in which the conductive interconnects are formed. Also, the local step at the boundary between the close interconnect region and the coarse interconnect region is prevented.

When a dummy pattern is formed on some layer, data about a two-dimensional array of islands each consisting of an assemblage of polygons is prepared. Data about the dummy pattern is created by performing logical operations on figures or features of the two-dimensional array of islands and on the pattern of conductive interconnects on said some layer. The dummy pattern is created from the data created in this way. In this way, a dummy pattern of a small area can be automatically created on the same layer as the layer having the conductive interconnects by performing simple logical operations on the patterns or figures.

When contact holes are etched, data about a dummy pattern is created from data about contact regions on layers which are at least two layers apart upwardly from some layer. The dummy pattern is formed from this data about the dummy pattern.

In this method, regions located under the regions having the contact holes are all provided with dummy patterns and so any step between contact hole openings in the same layer can be prevented.

As a result, the openings of the contact holes are uniform in height. This suppresses variations in the diameters of the openings of the contact holes. Furthermore, the contact holes can be etched to a uniform depth. Consequently, the amount of overetching can be reduced. Also, the above-described crown can be prevented.

Other objects and features of the invention will appear in the course of the description thereof, which follows.

DETAILED DESCRIPTION OF THE PREFERRED EMBODIMENTS

Figure 4:
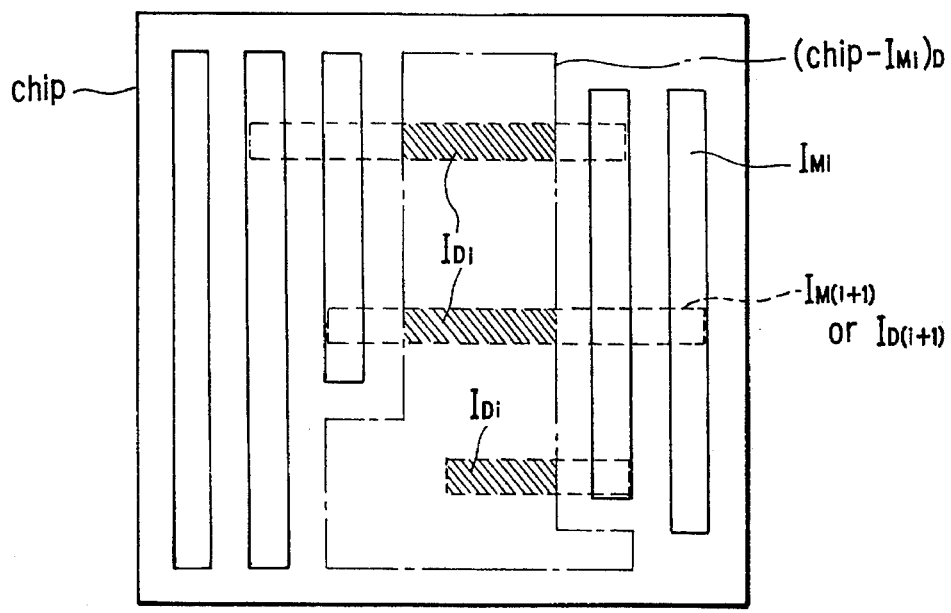
FIG. 4 is a conceptual plan view of a dummy pattern forming a first example of the invention.

Referring to FIG. 4, there is shown a first example of the present invention. This first example is applied to a semiconductor device having n (where n is an integer equal to or greater than 2) metallization layers which are patterned into conductive interconnects. In the present example, the metallization layers are made of aluminum. A sequence of steps for creating data about the metallizations on the layers is now described by referring to the flowchart of FIG. 5. The data is created by the use of a CAD (computer-aided design) system.

Figure 5:
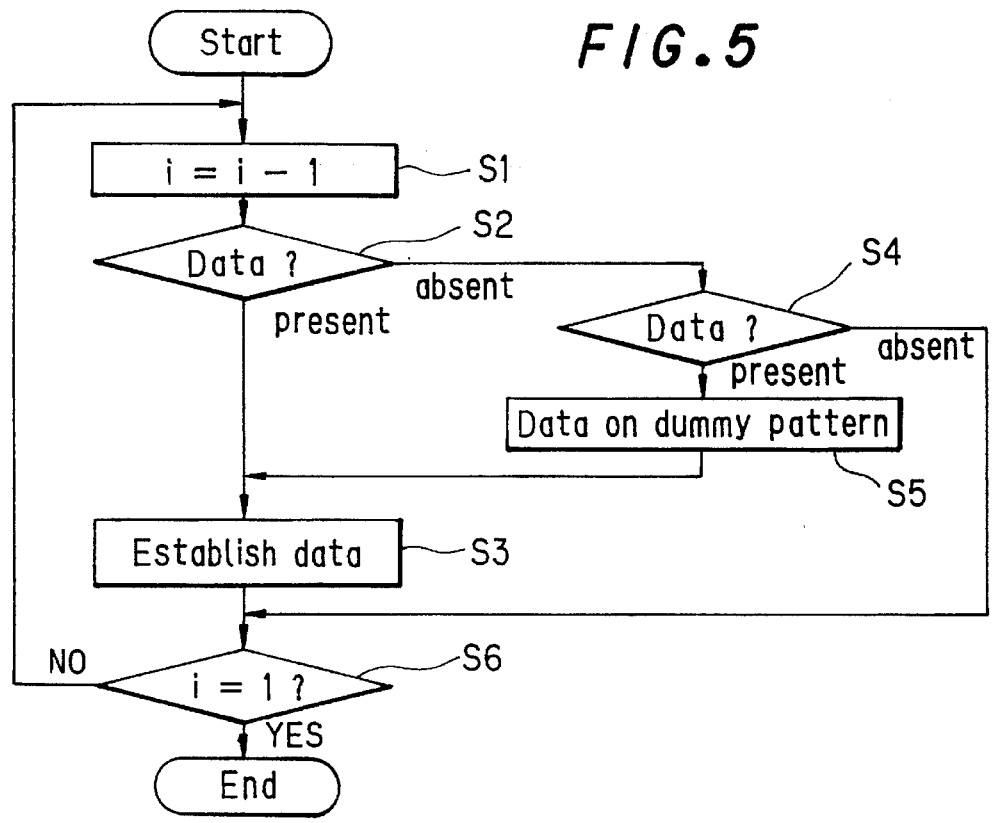
FIG. 5 is a flowchart illustrating a sequence of steps for creating data about a conductive interconnect pattern in the first example.

In FIG. 5, the (n−1)th layer for which data about a conductive interconnect pattern should be created is first selected (step 1). Then, a decision is made as to whether data about the conductive interconnect pattern in a certain region on this (n−1)th layer is present or absent (step 2). If the data exists about this region, the data about the conductive interconnect pattern is established directly as conductive interconnect pattern data about the region (step 3).

On the other hand, with respect to a region for which data on conductive interconnects does not exist, a decision is made as to whether data about a conductive interconnect pattern in the corresponding region on the upper layer, or the nth layer, exists (step 4). If such data exists, data about the dummy pattern is created from the former data (step 5). Control then goes to step 3, where the data about the dummy pattern is established as data about the conductive interconnect pattern in this region. The manner in which the data about the dummy pattern is created in step 5 is described in detail later.

In this manner, with respect to the (n−1)th layer, data about conductive interconnects is created for each region. After establishing the data about a conductive interconnect pattern in the (n−1)th layer, control returns to step 1 via step 6. Then, data about the (n−2)th layer is processed in the same way as in the case of the (n−1)th layer. Thus, data about conductive interconnects is established for each region. The same processing is repeated up to the first layer.

A method of actually creating data about a dummy pattern in step 5 described above is now described by referring to the conceptual plan view of FIG. 4. Let Chip be data about a region on which a dummy pattern should be defined. Let $I_{Mi}$ be data about a region occupied by signal lines and power lines forming an aluminum conductive interconnect pattern of the ith layer. Let $I_{Di}$ be data (hereinafter referred to as the dummy data pattern) which is sought for, or data about a dummy pattern on the ith layer.

Data about the region in which the dummy pattern should be defined minus the region occupied by conductive interconnects is given by Chip–$I_{Mi}$. This data Chip–$I_{Mi}$ is decremented to define a region (hereinafter referred to as the dummy pattern region). Let (Chip–$I_{Mi})_D$ be data about this dummy pattern region.

This decrement processing is performed to reduce a region located around some region by a given value which is greater than the minimum rule pitch of conductive interconnects. This decrement processing gives the spacing S between the region $I_{Mi}$ occupied by conductive interconnects including signal lines and power lines and the dummy pattern $I_{Di}$. Usually, the spacing S assumes a maximum value which permits flattening of the device surface. In the present example, this given value can be set to 2 μm, for example.

Then, the data $I_{Di}$ about the dummy pattern on the ith layer is found by ANDing the data (Chip–$I_{Mi})_D$ about this dummy pattern region with data $I_{M(i+1)}$ about conductive patterns on the (i+1)th layer or with the data $I_{D(i+1)}$ about the dummy pattern. This AND is given by $$I_{Di} = (Chip-I_{Mi})_D \times (I_{M(i+1)} + I_{D(i+1)}) \quad (1)$$

where × indicates a logical AND, and + indicates a logical OR. These logical operators can also be applied to the description given below. The dummy pattern on the ith layer is created from the data $I_{Di}$ about the dummy pattern.

In this way, when data about a dummy pattern on some layer is created, logical operations are performed, using data about conductive interconnects or dummy pattern on the upper layer. Hence, the data about the dummy pattern can be automatically created by performing simple logical operations on data about figures or features.

Figure 6:
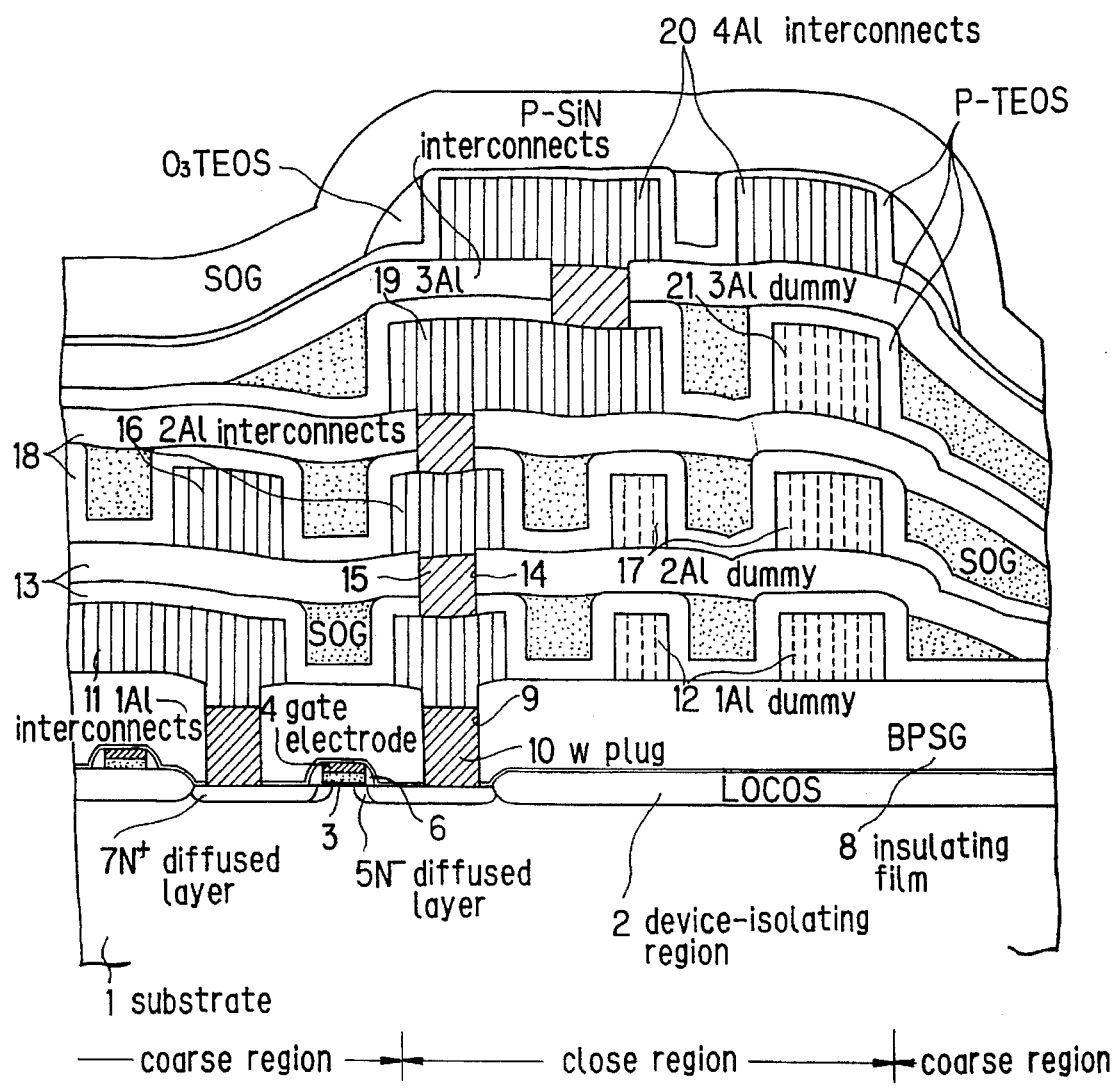
FIG. 6 is a cross-sectional view of a device according to the first example of the invention.

FIG. 6 is a cross-sectional view of a device having four layers on each of which aluminum interconnects are formed. This device has dummy patterns created, based on dummy pattern data $I_{Di}$ formed in the first example described above. A process for manufacturing this device is described below.

A device-isolating region 2 is formed on the surface of a p-type semiconductor substrate 1 by LOCOS or other method. A gate oxide film 3 is formed, and then a gate electrode 4 is fabricated from tungsten polycide or the like.

Subsequently, using the device-isolating region 2 and the gate electrode 4 as a mask, ions are implanted to form an N⁻ diffused region 5 having a dopant concentration of $10^{17}$ to $10^{19}/cm^3$ and having a lightly doped structure (LDD). LDD spacers 6 are formed on the side walls of the gate electrode 4. Thereafter, using the gate electrode 4 and the LDD spacers 6 as a mask, arsenic ions (As$^+$) or phosphorus ions (P$^+$) are implanted. The laminate is appropriately thermally treated. As a result, an N$^+$ diffused layer 7 having a dopant concentration exceeding $10^{20}$/cm$^3$ is formed.

Then, one or a combination of SiO$_2$ (NSG), PSG, BPSG, and SOG (spin on glass) is deposited by CVD to form an insulating film. If necessary, the insulating film is etched back or the BPSG film is treated at a high temperature of 800° to 900° C. so that the film may flow. In this way, a flat insulating film 8 is formed.

Contact holes 9 which extend across both N$^+$ diffused layer 7 and gate electrode 4 are formed in the insulating film 8. Those of the contact holes 9 which are located on the side of the gate electrode 4 are not shown. Tungsten plugs 10 are buried in the contact holes 9.

Instead of burying the tungsten plugs 10, aluminum may be buried in the contact holes 9. In particular, a barrier metal TiN/Ti is sputtered. Then, aluminum containing silicon is sputtered up to a thickness of several hundred nanometers while maintaining the wafer at a high temperature exceeding 500° C. The surface of the aluminum layer is made to flow so that the aluminum may be buried in the holes. This technique is referred to as high-temperature aluminum sputtering.

After forming the tungsten plugs 10, a conductive interconnect pattern 11 of aluminum on the first layer and a dummy pattern 12 of aluminum on the first layer are fabricated from a composite film of Ti, AlSiCu, TiON, TiN, or other material. At this time, data about the aluminum dummy pattern 12 is obtained by substituting i= 1 into the logical operational formula of Eq. (1).

Then, plasma TEOS SiO$_2$, O$_3$ TEOS SiO$_2$, or the like is deposited as a several hundred nanometer-thick film. Thereafter, SOG is coated and etched back so that it may be buried in the step portions in the aluminum portions on the first layer. Then, plasma TEOS SiO$_2$, O$_3$ TEOS SiO$_2$, or the like is deposited again to form an interlayer insulating film 13.

Subsequently, contact holes 14 which reach the aluminum interconnect pattern 11 on the first layer are formed in the interlayer insulating film 13. Tungsten (W) plugs 15 are buried in the contact holes 14. Instead of the tungsten plugs 15, high-temperature aluminum may be used.

Then, an aluminum interconnect pattern 16 on the second layer and an aluminum dummy pattern 17 on the second layer are fabricated from a composite film of Ti, AlSiCu, TiON, TiN, or other material. At this time, data about the aluminum dummy pattern 17 is obtained by substituting i= 2 into the logical operational formula of Eq. (1).

Subsequently, interlayer insulating layers, contact holes, aluminum interconnect patterns 19, 20, and an aluminum dummy pattern 21 are successively formed on third and fourth layers by the process described above. At this time, data about the aluminum dummy patterns on these layers is given by the logical operational formula of Eq. (1).

Figure 1A:
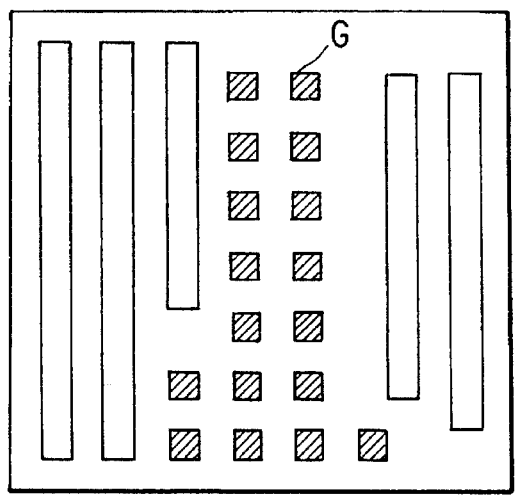
FIGS. 1A and 1B are conceptual plan views of conventional dummy patterns.
Figure 1B:
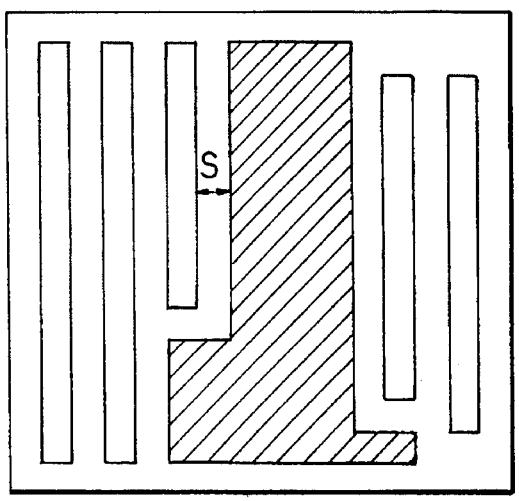
Figure 2:
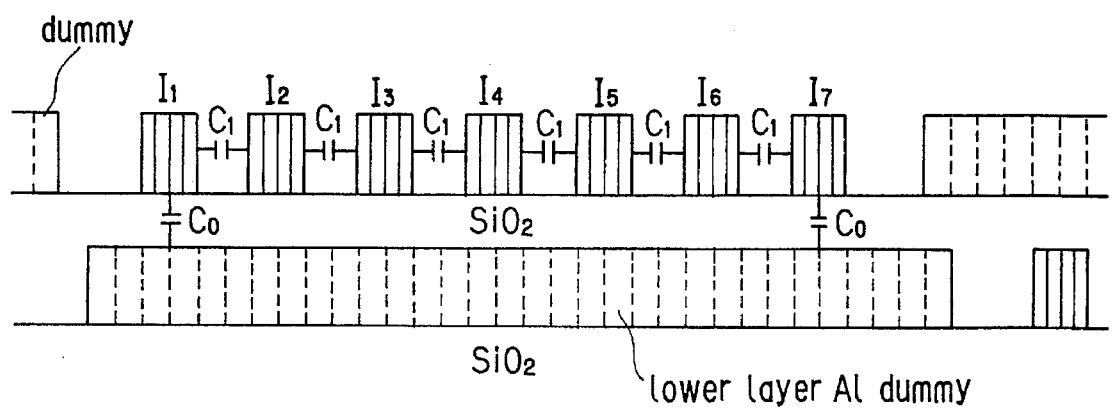
FIG. 2 is a conceptual diagram of capacitance between Al interconnects, illustrating problems with the prior art techniques.
Figure 3A:
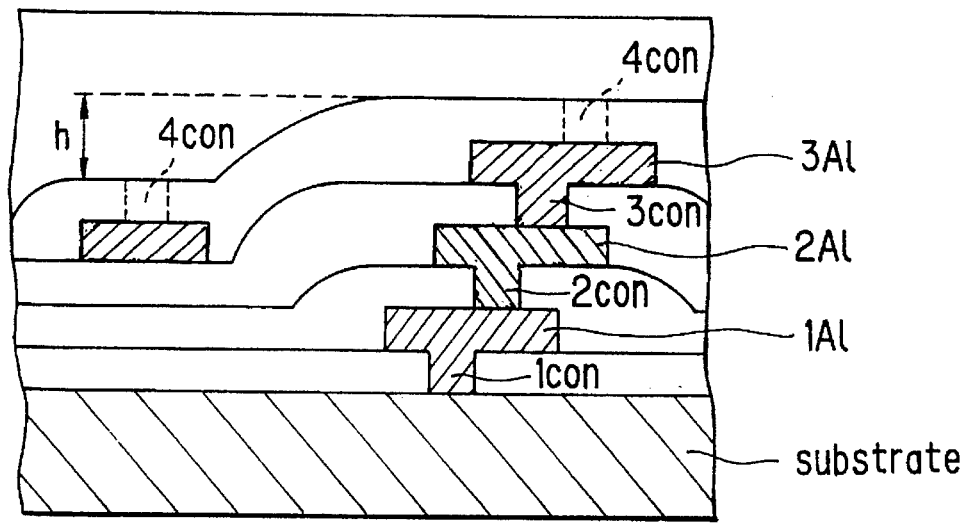
FIGS. 3A and 3B are cross-sectional views of devices, illustrating the conventional method of etching contact holes.
Figure 3B:
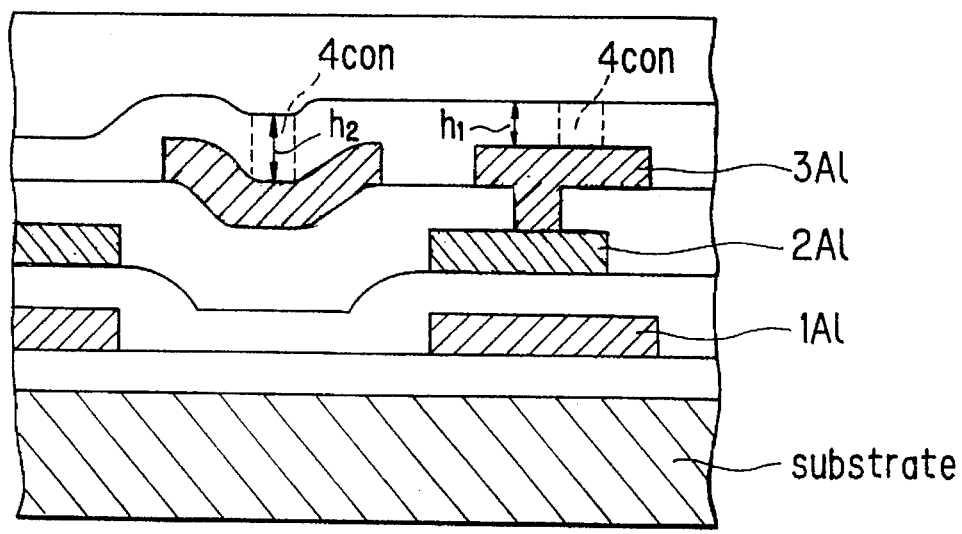

As described previously, when the dummy patterns are formed on the various layers, data $I_{Di}$ about the dummy patterns on the layers is created from the logical operational formula of Eq. (1). The dummy patterns are formed, based on the data $I_{Di}$. As can be seen from FIGS. 3A and 3B, the aluminum interconnect pattern 11 (1Al) on the first layer, the aluminum interconnect pattern 16 (2Al) on the second layer, the dummy pattern 12 (1Al) on the first layer, and the dummy pattern 17 (2Al) on the second layer are located under the interconnect pattern 19 (3Al) on the third layer. On the surface of the device, the interconnect pattern 19 (3Al) on the third layer is flush with the interconnect pattern 16 (2Al) on the second layer. Thus, the absolute step on the surface of the device is reduced. Consequently, the flatness on the device surface can be improved. Hence, a greater margin is afforded to the focusing operation of the photolithography step which is carried out to form the contact portions on the various layers and aluminum interconnects. As a result, finer conductive interconnects can be fabricated.

In the first example described above, in each region on the surface of the device, aluminum interconnect patterns or aluminum dummy patterns are disposed from the first layer to the (m−1)th layer (where $2 \leq m \leq n$) within the region where the aluminum interconnect pattern on the mth layer is disposed. As can be seen from FIG. 6, a large local steps may be produced at the boundary between a close interconnect region and coarse interconnect regions.

Figure 7:
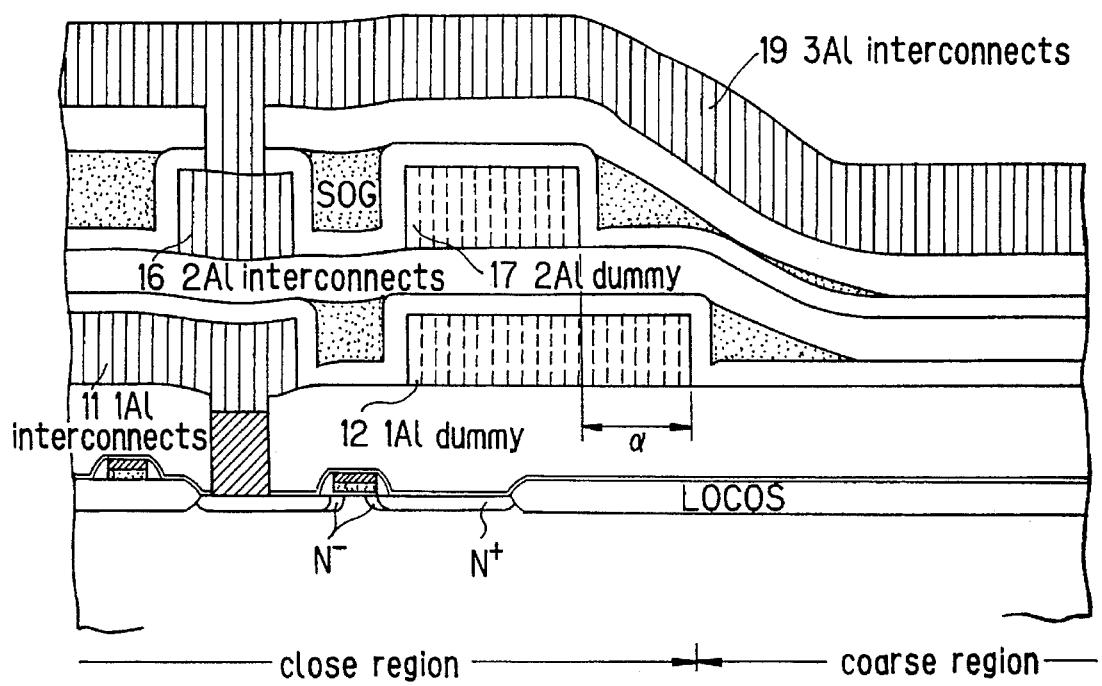
FIG. 7 is a cross-sectional view of a device according to a second example of the invention.

A second example of the invention is described next. As a modification of the first example, the conductive interconnect pattern or dummy pattern on the ith layer is formed in a region wider than the region where the conductive interconnect pattern or dummy pattern on the (i+1)th layer is created. For example, as shown in FIG. 7, aluminum interconnects 16 (2Al) on the second layer and a dummy pattern 17 (2Al) on the second layer are shifted a given distance α inwardly from aluminum interconnects 11 (1Al) on the first layer and aluminum dummy pattern 12 (1Al).

The given distance α is set to tens of microns to prevent patterning of aluminum layers from being affected by the steps on the underlying interlayer insulating film.

In this modification, aluminum interconnect patterns and aluminum dummy patterns are disposed more inwardly with going to a higher layer. As can be seen from FIG. 7, the tilt at the boundary between a close interconnect region and a coarse interconnect region is mild. In consequence, the local step at this boundary can be suppressed.

Figure 8:
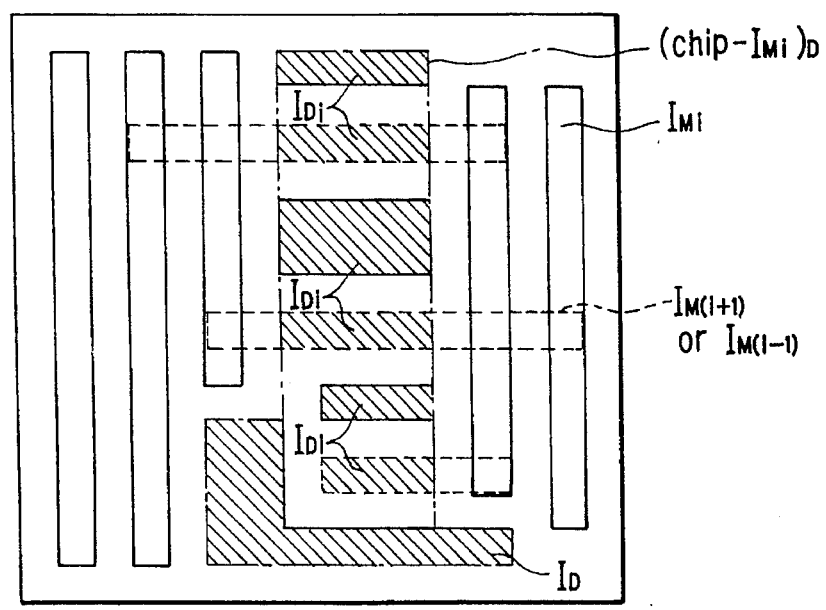
FIG. 8 is a conceptual plan view of a dummy pattern forming a third example of the invention.

A third example of the invention is described by referring to the conceptual plan view of FIG. 8. In the same way as in the first example, let Chip be data about a region in which a dummy pattern should be defined. Let $I_{Mi}$ be data about a region occupied by signal lines and power lines forming an aluminum conductive interconnect pattern on the ith layer. Let $I_{Di}$ be data about a dummy pattern on the ith layer, or the data sought for.

Data about the region in which the dummy pattern should be defined minus the region occupied by conductive interconnects is given by Chip–$I_{Mi}$. This data Chip–$I_{Mi}$ is decremented to define a region (hereinafter referred to as the dummy pattern region). Let (Chip–$I_{Mi}$)$_D$ be data about this dummy pattern region.

First, the AND of the data (Chip–$I_{Mi}$)$_D$ about the dummy pattern region, data $I_{M(i+1)}$ about the region occupied by conductive interconnects on the (i+1)th layer, and data $I_{M(i-1)}$ about the region occupied by conductive interconnects on the (i−1)th layer is calculated in accordance with the equation:

$$I_{Di1} = (Chip-I_{Mi})_D \times I_{M(i+1)} \times I_{M(i-1)} \qquad (2)$$

Thus, data $I_{Di1}$ about the first dummy pattern is computed. Then, data given by the following equation is calculated:

$$I_{Di1} = (Chip-I_{Mi}) \times I_{M(i+1)} \times I_{M(i-1)} \qquad (3)$$

Then, data $I_{Di2}$ about a second dummy pattern is calculated from the equation given below.

$$I_{Di2} = (Chip-I_{Mi}-I_{Di1})_D \times I_{M(i+1)} \qquad (4)$$

This gives the AND of data about a first region and data $I_{M(i+1)}$ about the region occupied by conductive interconnects on the (i+ 1)th layer. The first layer is equal to the dummy pattern region minus the region defined by the dummy pattern data $I_{Di1}$. Then, data $I_{Di2}$ given by the following equation is found:

$$I_{Di2}=(Chip-I_{Mi}-I_{Di1})_D \times I_{M(i+1)} \qquad (5)$$

Thereafter, the AND of data about a second region and data $I_{M(i-1)}$ about the region occupied by conductive interconnects on the (i- 1)th layer is calculated from Eq. (6) below. The second region is equal to the dummy region minus the regions defined by the dummy pattern data $I_{Di1}$ and $I_{Di2}$.

$$I_{Di3}= (Chip-I_{Mi}-I_{Di1}-I_{Di2})_D \times I_{M(i-1)} \qquad (6)$$

Then, data $I_{Di3}$ given by the following equation is calculated:

$$I_{Di3}= (Chip-I_{Mi}-I_{Di1}-I_{Di2}) \times I_{M(i-1)} \qquad (7)$$

Then, data $I_{Di4}$ about a fourth region which is equal to the dummy pattern region minus the regions defined by the dummy pattern data $I_{Di1}$, $I_{Di2}$, and $I_{Di3}$ is calculated from the equation:

$$I_{Di4}= (Chip-I_{Mi}-I_{Di1}-I_{Di2}-I_{Di3})_D \qquad (8)$$

The AND of dummy pattern data $I_{Di1}$, $I_{Di2}$, $I_{Di3}$, and $I_{Di4}$ is calculated from the equation:

$$I_{Di}= I_{Di1}+ I_{Di2}+ I_{Di3}+I_{Di4} \qquad (9)$$

In this way, data $I_{Di}$ about the dummy pattern on the ith layer, or the data sought for, is obtained. In Eq. (9) above, "+" indicates a logical OR.

As described above, in this method of creating data according to this third example, the dummy pattern data $I_{Di}$ can be created by performing simple arithmetic operations on figures or features, using data $I_{M(i+1)}$ and $I_{M(i-1)}$ about conductive interconnect patterns on the upper and lower layers.

Figure 9:
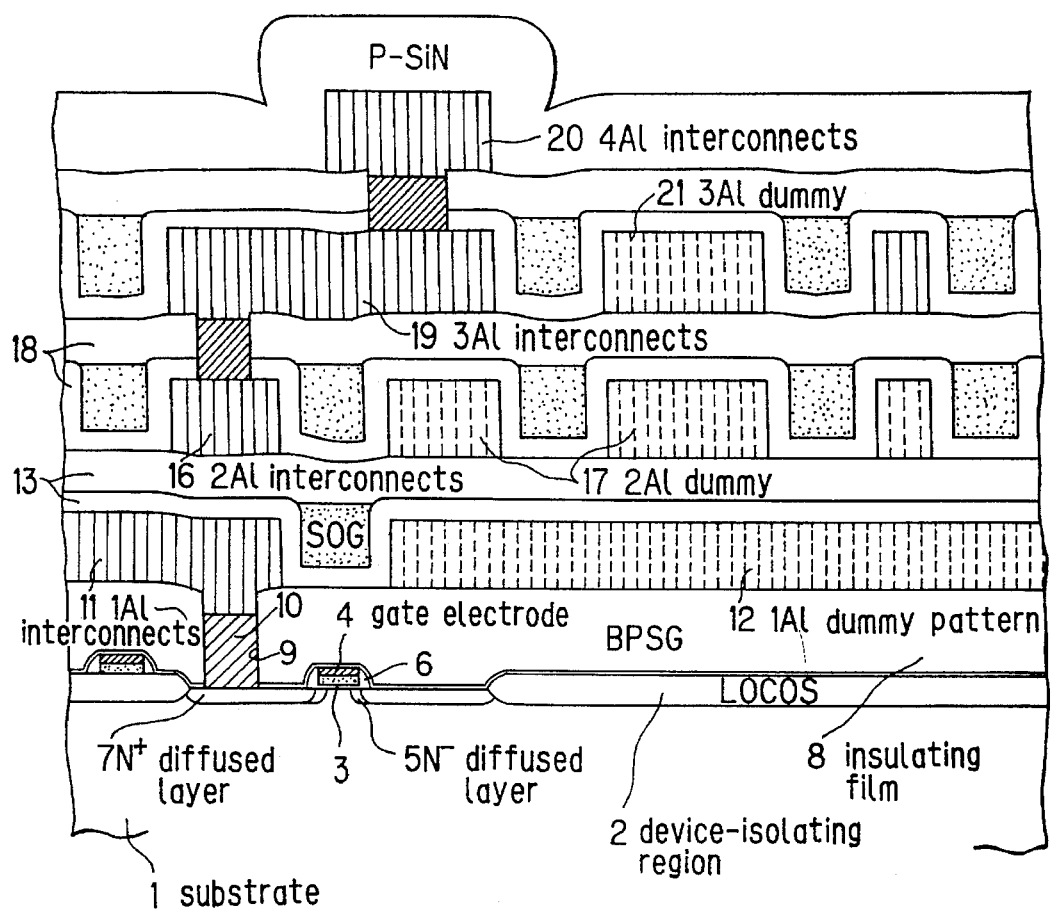
FIG. 9 is a cross-sectional view of a device according to the third example of the invention.

FIG. 9 is a cross-sectional view of a device having four aluminum metallization layers having dummy patterns which are created from the pattern data $I_{Di}$. A process for manufacturing this device is described below.

A device-isolating region 2 is formed on the surface of a p-type semiconductor substrate 1 by LOCOS or other method. A gate oxide film 3 is formed, and then a gate electrode 4 is fabricated from tungsten polycide or the like.

Subsequently, using the device-isolating region 2 and the gate electrode 4 as a mask, ions are implanted to form an N⁻ diffused region 5 having a dopant concentration of $10^{17}$ to $10^{19}/cm^3$ and having a lightly doped structure (LDD). LDD spacers 6 are formed on the side walls of the gate electrode 4. Thereafter, using the device-isolating region 2, the gate electrode 4, and the LDD spacers 6 as a mask, arsenic ions ($As^+$) or phosphorus ions ($P^+$) are implanted. The laminate is appropriately thermally treated. As a result, an N⁺ diffused layer 7 having a dopant concentration exceeding $10^{20}$ /cm³ is formed.

Then, one or a combination of $SiO_2$ (NSG), PSG, BPSG, and SOG is deposited by CVD to form an insulating film. If necessary, the insulating film is etched back or the BPSG film is treated at a high temperature of 800° to 900° C. so that the film may flow. In this way, a flat insulating film 8 is formed.

Contact holes 9 which extend across the N⁺ diffused layer 7 and the gate electrode 4 are formed in the insulating film 8. Those of the contact holes 9 which are located on the side of the gate electrode 4 are not shown. Tungsten plugs 10 are buried in the contact holes 9.

Instead of burying the tungsten plugs 10, aluminum may be buried in the contact holes 9. In particular, a barrier metal TiN/Ti is sputtered. Then, aluminum containing silicon is sputtered up to a thickness of several hundred nanometers while maintaining the wafer at a high temperature exceeding 500° C. The surface of the aluminum layer is made to flow so that the aluminum may be buried in the holes.

After forming the tungsten plugs 10, aluminum interconnects 11 (1Al) on the first layer and an aluminum dummy pattern 12 on the first layer are fabricated from a composite film of Ti, AlSiCu, TiON, TiN, or other material. At this time, data about the aluminum dummy pattern 12 is obtained by substituting i= 1 into the logical operational formulas of Eqs. (2)–(9).

Then, plasma TEOS $SiO_2$, $O_3$ TEOS $SiO_2$, or the like is deposited as a several hundred nanometer-thick film. Thereafter, SOG is coated and etched back so that it may be buried in the aluminum step portions on the first layer. Then, plasma TEOS $SiO_2$, $O_3$ TEOS $SiO_2$, or the like is deposited again to form an interlayer insulating film 13.

Subsequently, aluminum interconnects 16 (2Al) on the second layer and an aluminum dummy pattern 17 (2Al) on the second layer are fabricated from a composite film of Ti, AlSiCu, TiON, TiN, or other material. At this time, data about the aluminum dummy pattern 17 on the second layer is obtained by substituting i= 2 into the logical operational formulas of Eqs. (2)–(9).

Thereafter, interlayer insulating layers, contact holes, aluminum interconnect patterns 19, 20, and an aluminum dummy pattern 21 are successively formed on third and fourth layers by the process described above. At this time, data about the aluminum dummy patterns on these layers is given by the logical operational formulas of Eqs. (2)–(9).

That is, in the above-described third example, dummy pattern data is defined in terms of data about conductive interconnect patterns on the upper and lower layers. Using this dummy pattern data, the dummy pattern region (Chip– $I_{Mi})_D$ is divided into some parts. Dummy patterns are created in these parts and under the conductive interconnects (indicated by hatching in FIG. 8).

In this way, dummy patterns are formed in portions of dummy pattern regions, as well as under the conductive interconnects on the upper layer. Therefore, a large local step is not formed at the boundary between a close interconnect region and a coarse interconnect region. The absolute step on the surface of the device can be reduced. As can be seen from FIG. 7, the capacitance between aluminum interconnects can be reduced.

Figure 10:
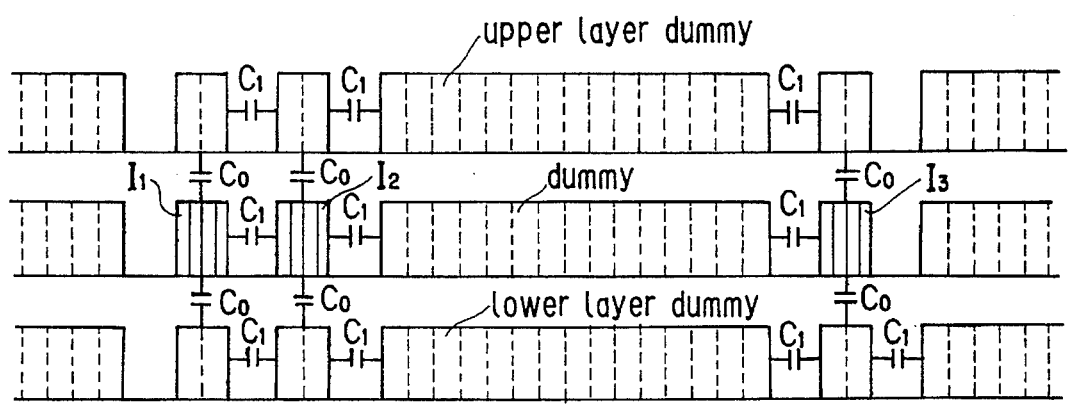
FIG. 10 is a conceptual diagram of capacitance between Al interconnects in the third example.

In FIG. 10, let $I_1$, $I_2$, and $I_3$ be aluminum interconnects. Let $C_0$ be the capacitance between the upper and lower surfaces of each conductive interconnect. Let $C_1$ be the capacitance of the side surfaces of the interconnects. The capacitance between the interconnects $I_1$ and $I_2$ is given by $$Ca \neq C_1+ (2C_0C_1)/(2C_1+ C_0) \qquad (10)$$

The capacitance between the interconnects $I_2$ and $I_3$ is given by $$Cb \neq C_1/2+ (C_0C_1)/(C_1+ C_0) \qquad (11)$$

That is, the capacitance Cb between the interconnects $I_2$ and $I_3$ is on the same order as the capacitance Ca between the interconnects $I_1$ and $I_2$ but smaller than the capacitance of the prior art structure where dummy patterns are laid over the whole dummy pattern region. If the space between each conductive interconnect and its adjacent dummy pattern is increased to the greatest extent that is permitted by the flatness, then the capacitance Cb between the interconnects $I_2$ and $I_3$ can be reduced to a negligible value. Since the capacitance between the aluminum interconnects can be reduced in this way, crosstalk between the conductive interconnects due to the capacitance can be decreased.

Figure 11:
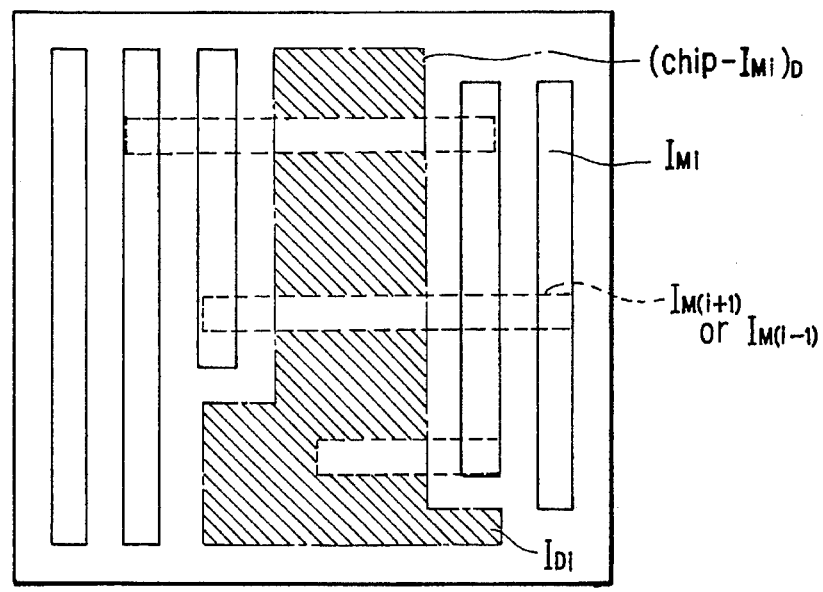
FIG. 11 is a conceptual plan view of a modification of a fourth example of the invention.

A fourth example which is a modification of the above-described third example is described by referring to the plan view of FIG. 11. In this modification, data $I_{Di1}$, $I_{Di2}$, and $I_{Di3}$ which are found from the logical operational formulas of Eqs. (2), (4), and (6) are subtracted from the dummy pattern region data $(Chip-I_{Mi})_D$ to find dummy pattern data $I_{Di}$, as given by $$I_{Mi} = (Chip-I_{Mi})_D - I_{Di1} - I_{Di2} - I_{Di3} \quad (12)$$

Figure 12:
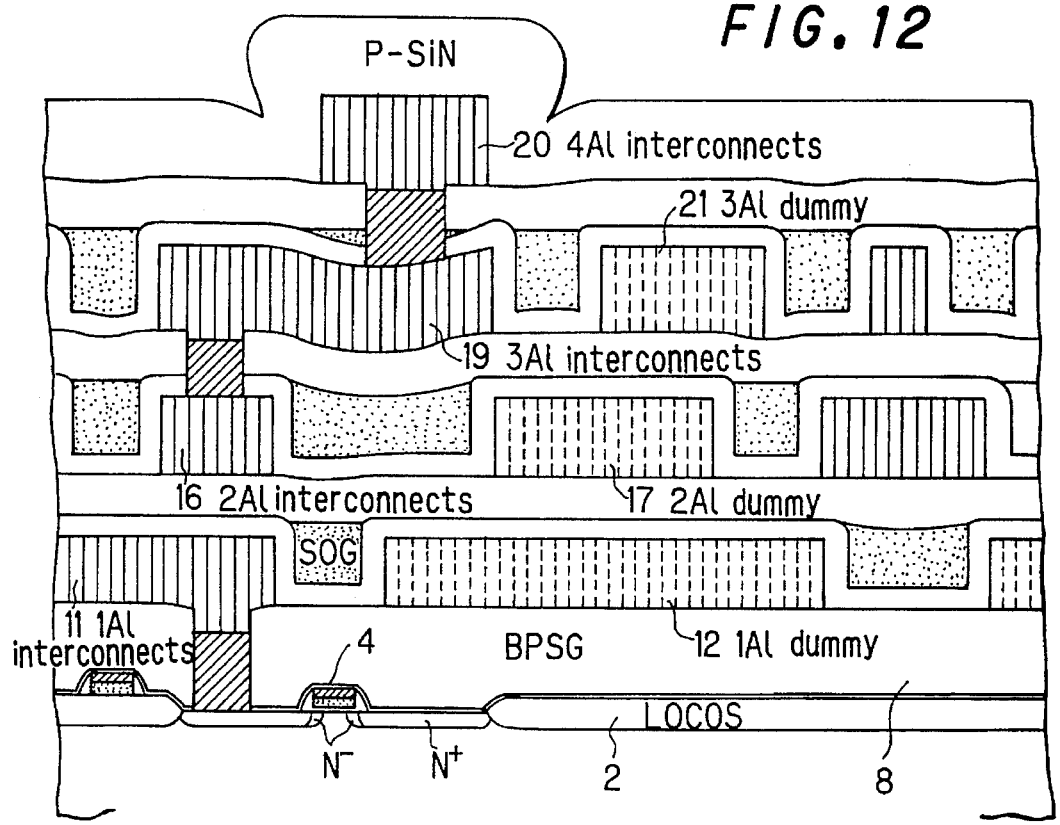
FIG. 12 is a cross-sectional view of a device according to the modification of the fourth example.

FIG. 12 is a cross-sectional view of a device having dummy patterns created, based on the pattern data $I_{Di}$. The process for manufacturing this device is essentially the same as the process illustrated in FIG. 6 and thus is not described below.

In the third example, the dummy pattern region $(Chip-I_{Mi})_D$ is divided, using the dummy pattern data defined in terms of data about conductive interconnects on the upper and lower layers. On the other hand, in this modification, slits are formed in the dummy pattern region $(Chip-I_{Mi})_D$, using the dummy pattern data defined in terms of data about conductive interconnects on the upper and lower layers. Dummy patterns are created on the remaining dummy pattern region indicated by hatching in FIG. 11.

This modification is similar to the second example in flattening of the device surface and in reduction of capacitance between aluminum interconnects. Since only slits are formed in the dummy pattern region $(Chip-I_{Mi})_D$, calculational formulas are made simpler than those used in the third example. Hence, the amount of data used for calculations can be reduced.

Figure 13:
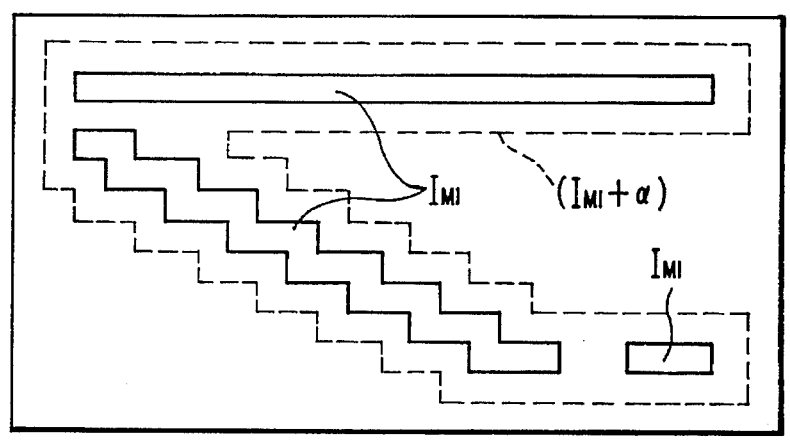
FIG. 13 is a diagram showing the pattern of conductive interconnects in a fifth example of the invention.

A fifth example of the invention which is applied to a grid method is described now. A device has a multilayer aluminum metallization structure. A dummy pattern is formed on the ith layer which also has a conductive interconnect pattern as shown in FIG. 13.

First, data about a two-dimensional array of islands each consisting of an assemblage of polygons is prepared. In the present example, each polygon is a square, and the array consists of 3×3 squares, as shown in FIG. 14.

Figure 14:
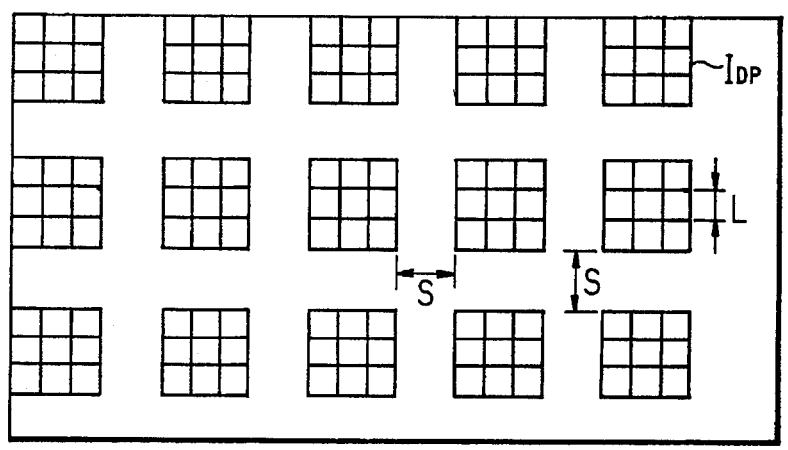
FIG. 14 is a diagram showing a dummy pattern in the fifth example.

In FIG. 14, the width L of each square forming the island-shaped pattern is required to satisfy the design rule for the conductive interconnects. The spacing S between the successive islands is so set that the relation 2L< S is catered for.

Let $I_{Mi}$ be data about a region occupied by signal lines and power lines forming conductive interconnect pattern of the ith layer. Let $I_{Dp}$ be data about a dummy pattern consisting of islands. Let $I_{Di}$ be data which should be found finally, or data about a dummy pattern on the ith layer.

First, data $I_{Mi}$ about conductive interconnects is incremented to obtain data $(I_{Mi}+\alpha)$. This increment processing is performed to enlarge some region by a given value $\alpha$ outwardly, the value $\alpha$ being in excess of the minimum rule pitch of the conductive interconnects.

Then, the data $(I_{Mi}+\alpha)$ obtained by the data increment processing is ANDed with dummy pattern data $I_{Dp}$. The resulting data is subtracted from the dummy pattern data $I_{Dp}$, thus producing dummy pattern data $I_{Di}$ about the ith layer. A logical operational formula for this is given below.

$$I_{Di} = I_{Dp} - \{(I_{Mi}+\alpha) \times I_{Dp}\} \quad (13)$$

Figure 15:
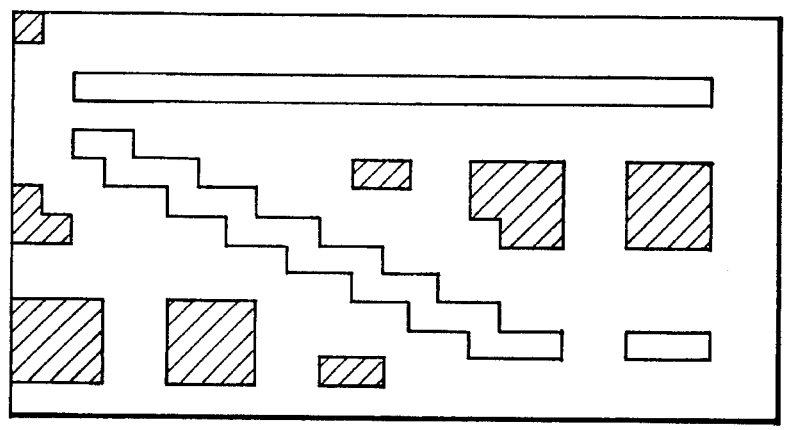
FIG. 15 is a diagram showing the completed pattern of conductive interconnects in the fifth example.

Data $(I_{Di} + I_{Mi})$ depending on the AND of the dummy pattern data $I_{Di}$ and the conductive interconnect data $I_{Mi}$ is the final conductive interconnect pattern data on the ith layer. Based on this final conductive interconnect pattern data, a conduction pattern and a dummy pattern are written into the ith layer. The produced conduction pattern is shown in FIG. 15.

When dummy pattern data $I_{Di}$ on the ith layer is created, data $I_{Dp}$ about a two-dimensional array of islands each consisting of an assemblage of polygons is prepared. Data $I_{Di}$ about the dummy pattern on the ith layer can be created by performing simple logical operations on figures or features since the data $I_{Dp}$ about the two-dimensional array of islands and the data $I_{Mi}$ about the pattern of conductive interconnects on the ith layer are arithmetically processed.

In the present example, islands each of which consists of an assemblage of polygons and hence is somewhat large are arranged in two dimensions unlike the prior art techniques in which small islands are arranged in two dimensions. Therefore, the amount of data used for calculations can be reduced compared with the amount of data used in the prior art method. Furthermore, the time required for the calculations can be shortened.

If the data increment amount $\alpha$ about the data $I_{Mi}$ about the pattern of conductive interconnects on the ith layer is so set as to satisfy the design rule for the conduction pattern, then it is not necessary to check the design rule for the dummy pattern which is created, based on the dummy pattern data $I_{Di}$. If dummy pattern data are finally merged into one set of data about the pattern, the amount of data processed during an EB conversion is not large.

Figure 16:
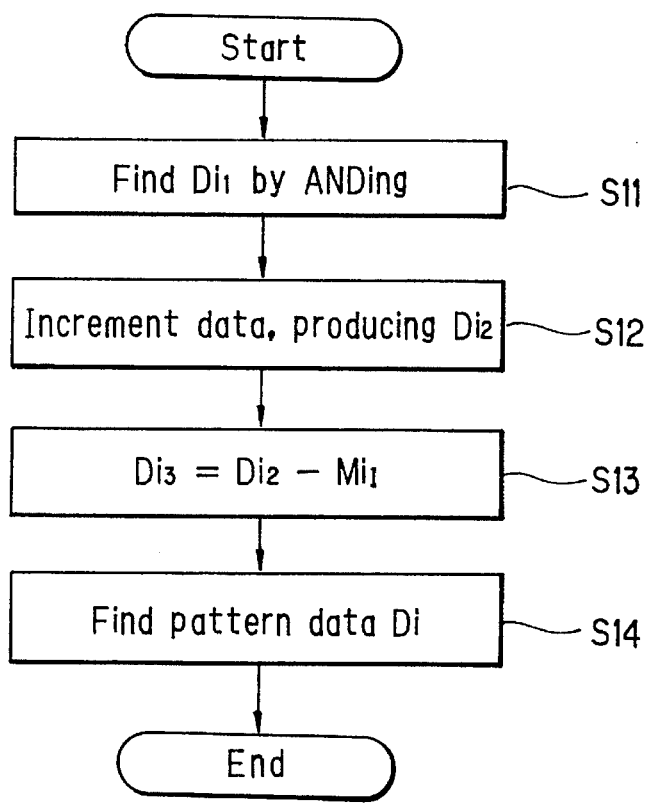
FIG. 16 is a flowchart illustrating a sequence of steps for creating data about a dummy pattern in a sixth example of the invention.

A sequence of steps for creating data about a dummy pattern when contact holes are formed is now described by referring to the flowchart of FIG. 16. This method forms a sixth example of the invention.

When data about a dummy pattern on the ith patterned conduction layer is created, data (hereinafter referred to as the contact region data) defining contact regions in which contact holes are formed and which are located over the (i+2)th layer are ANDed (step 11). Let $D_{i1}$ be data (first data) about this AND.

It is not necessary to take account of data about the contact region on the (i+1)th layer which is immediately over the ith layer, because a conductive pattern exists under this contact region from the first.

Then, in order to afford a margin to the size of the contact region, the data $D_{i1}$ about the AND is incremented, thus producing increment data (second data) $D_{i2}$ (step 12). It is necessary that the amount of increment be so set that the stepper's aligning accuracy is exceeded.

To prevent the original conduction pattern from being short-circuited by the formed dummy pattern, the increment data $M_{i1}$ of the conduction pattern data $M_i$ is subtracted from the increment data $D_{i2}$. As a result, differential data (third data) $D_{i3}$ is found (step 13).

It is necessary that the increment amount of the conduction pattern data $M_i$ be set in excess of the minimum possible linewidth $S_{min}$ of conductive interconnects or in excess of the minimum interconnect spacing $d_{min}$ which does not present serious parasitic capacitance and below the maximum interconnect gap $Gap_{max}$ that permits flattening.

Thereafter, the differential data $D_{i3}$ is decremented. Also, the remaining data is incremented by the same amount. Thus, final dummy pattern data $D_i$ is found (step 14). This increment amount must be in excess of half of the minimum possible linewidth of a dummy pattern.

Figure 17:
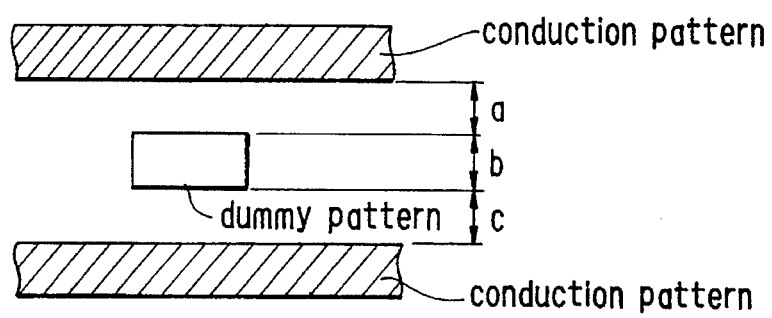
FIG. 17 is a diagram illustrating the worst situation which occurs when conductive interconnect patterns are flattened.

Those data which are contained in the found dummy pattern data $D_i$ and associated with values less than the minimum possible linewidth are removed by the processing of step 14. This processing is done, taking account of the worst situation which would occur when conductive interconnects are flattened. An example of the worst situation is illustrated in FIG. 17. If a and c are increment amounts $\Delta Ma$ in step 13, and if b is an increment amount $\Delta Mb$ in step 14, the dummy pattern data disappears. A gap of (2a+ b) is created between adjacent conductive interconnects.

As an example of a device having a linewidth of 0.35 μm, it is assumed that the minimum possible linewidth $S_{min}$ of conductive interconnects is 0.5 μm, the maximum interconnect gap $Gap_{max}$ is 5 μm, and the minimum interconnect spacing $d_{min}$ which does not produce annoying parasitic capacitance is 1 μm. In particular, the increment amount $\Delta Ma$ in step 13 lies within the range $$5 \; \mu m \leq \Delta Ma \leq 1 \; \mu m \tag{14}$$

The increment amount $\Delta Mb$ in step 14 lies within the range $$1 \; \mu m \leq 2 \times \Delta Mb \leq 5 \; \mu m - 2 \times \Delta Ma \tag{15}$$

Thus, we have $$.5 \; \mu m \leq \Delta Mb \leq .5 \; \mu m \tag{16}$$

Figure 18:
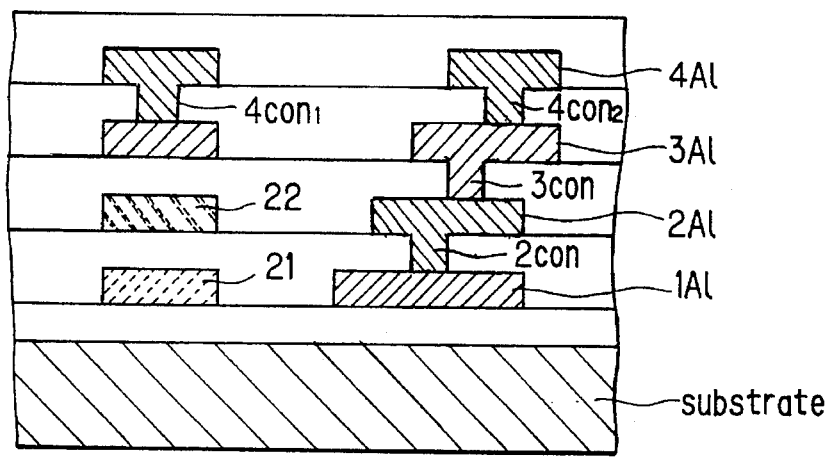
FIG. 18 is a cross-sectional view of a device according to the sixth example of the invention.

FIG. 18 is a cross-sectional view of a device having four aluminum metallization layers having dummy patterns which are created, based on the dummy pattern data $D_i$, in the sequence illustrated in FIG. 16.

The fourth through first layers have aluminum conductive patterns 4Al–1Al, respectively. Two contact holes $4con_1$ and $4con_2$ are formed to interconnect the patterns 4Al and 3Al. Another contact hole 3con is formed to interconnect the patterns 3Al and 2Al. A further contact hole 2con is formed to interconnect the patterns 2Al and 1Al.

In FIG. 18, no aluminum pattern exists on the left side of this figure on the first and second layers. A dummy pattern 21 is created on the first layer, based on pattern data created, using data about the contact regions $4con_1$ and $4con_2$ which are spaced three layers apart from this first layer upward. A dummy pattern 22 is formed on the second layer, based on pattern data which is created, using data about the contact regions $4con_1$ and $4con_2$ which are spaced 2 layers apart from this second layer upward.

Figure 19A:
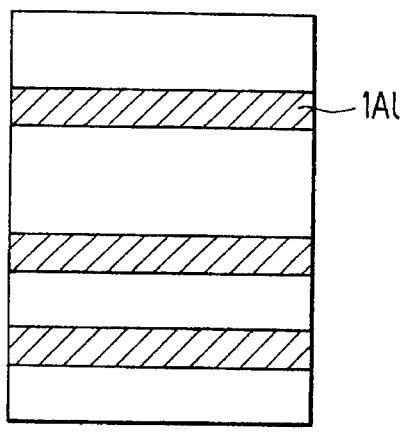
FIGS. 19A–19D are plan views of various layers created during formation of a dummy pattern in the sixth example.
Figure 19B:
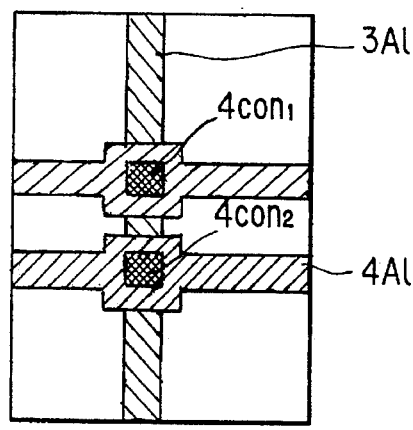

Formation of the dummy pattern on the first layer is described in greater detail by referring to FIGS. 19A–19D. As shown in FIG. 19A, the aluminum metallization (1Al) on the first layer is patterned into conductive interconnects. The aluminum metallizations (3Al and 4Al, respectively) on the third and fourth layers are patterned, as shown in FIG. 19B. The two contact holes $4con_1$ and $4con_2$ are formed.

Figure 19C:
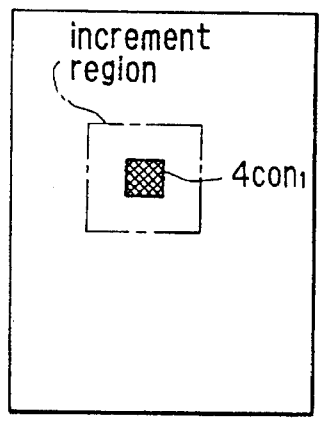
Figure 19D:
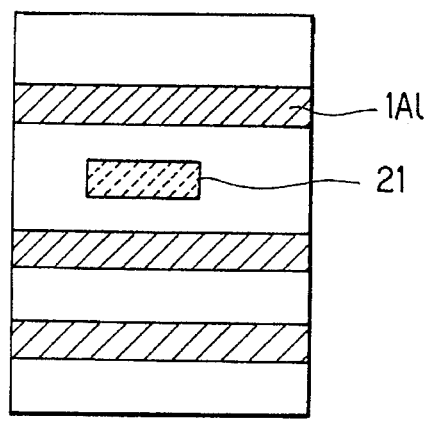

In this case, the conduction pattern 1Al exists under the contact hole $4con_2$ and, therefore, a dummy pattern is formed only under the contact hole $4con_1$. When data about this pattern is created, an increment region indicated by the dot-and-dash line is established around the contact region $4con_1$, as shown in FIG. 19C. The dummy pattern 1Al is formed, based on this increment region, as shown in FIG. 19D.

In this way, during formation of contact holes, the dummy pattern data is created, using data about contact regions on layers spaced two layers from some layer upward. A dummy pattern is created, based on the data. As a result, contact openings agree in height (in the present example, the height of the aluminum metallization 3Al). Furthermore, the interlayer film over the aluminum pattern 3Al has a uniform thickness. Consequently, variations in the diameters of the openings of the contact holes $4con_1$ and $4con_2$ can be suppressed. In addition, the amount of overetching can be reduced, because the contact holes are etched to a uniform depth. In consequence, the crown can be prevented.

As described thus far, in the present invention, when a dummy pattern is formed on some layer, data about features or figures are arithmetically processed, taking account of and using the conduction pattern or dummy pattern on the overlying layer. Thus, data about the dummy pattern is created. The dummy pattern is generated, based on this dummy pattern data. Therefore, this dummy pattern is located under the conduction pattern or dummy pattern on the overlying layer. Hence, the absolute step on the surface of the device can be reduced, and the flatness of the device surface can be enhanced.

At this time, the tilt at the boundary between the close conduction region and the coarse conduction region can be made mild by forming a dummy pattern in a region wider than the region where conductive patterns or dummy patterns are formed on the upper layers. In consequence, the local step at the boundary can be reduced.

When a desired dummy pattern is formed on some layer, the conductive interconnect pattern on the lower layer is taken into consideration, as well as the conductive interconnect pattern on the upper layer. Using data about these patterns, features or figures are arithmetically processed. Thus, data about the desired dummy pattern is created. The desired dummy pattern is created, based on this data. In this way, dummy patterns are formed in portions of other regions, as well as under the conductive interconnects on the upper layer, in a certain area excluding the region in which the desired conductive interconnect pattern is formed. Alternatively, dummy patterns are located in other regions excluding under the conductive interconnect pattern on the upper layer.

In this manner, the absolute step on the device surface can be reduced. Also, the flatness of the device can be enhanced. Where dummy patterns are formed over the whole region excluding the region in which conductive interconnects are formed, crosstalk between the interconnects which would otherwise be caused by increase in the capacitance between the interconnects can be prevented. In addition, a local step at the boundary between a close interconnect region and a coarse interconnect region can be prevented.

When a dummy pattern on a desired layer is formed, data about a two-dimensional array of islands each consisting of an assemblage of polygons is prepared. Logical operations are performed on data about this two-dimensional array of islands and on data about the pattern of the conductive interconnects on the desired layer. Thus, data about a dummy pattern is created. This dummy pattern is created, based on this data. In this way, a dummy pattern of a small area can be automatically created on the same layer as the layer having the conductive interconnects by performing simple logical operations on the patterns or figures. Furthermore, the absolute step on the device surface is modified. Substandard conductive interconnects and crosstalk between conductive interconnects can be suppressed.

By applying the novel method of creating a dummy pattern in this way, the absolute step on the device surface be modified. Therefore, the margin given to the focusing operation in the photolithography step for fabricating contact portions and aluminum interconnects on various layers can be improved. This makes it possible to fabricate finer conductive interconnects. Also, the reliability of patterned multilayer aluminum metallization can be improved.

When contact holes are formed, data about a dummy pattern is created, using data about contact regions on layers which are spaced two layers from some layer upward. The dummy pattern is formed, based on the pattern data. Consequently, regions located under the region having contact holes are all provided with dummy patterns. As a result, steps on the contact regions can be prevented. In consequence, the openings of the contact regions are uniform in height. Thus, variations in the diameters of the openings in the contact holes can be suppressed. Also, the contact holes are etched to a uniform depth. Hence, the amount of overetching can be reduced, and the crown can be prevented.

What is claimed is:

1. A method for forming a dummy pattern on a semiconductor device having interconnect patterns on plural patterned layers of metallization, where n is the number of layers, said method comprising the steps of:

creating data defining the location of a dummy pattern on the ith layer (where i is an integer and satisfies a relation given by ($2 \leq i < n$), using both data defining the location of a conducting interconnect pattern on an (i+1)th layer and data defining the location of a conducting interconnect pattern on an (i−1)th layer, when said dummy pattern should be formed on said ith layer; and forming this dummy pattern, based on said data defining the location of the dummy pattern on said ith layer.

2. A method for forming a dummy pattern as set forth in claim 1, wherein said data defining the location of the dummy pattern on said ith layer reflects a logical AND of first data, second data, third data, and fourth data defining the location of a fourth region, said first data reflecting a logical AND of data defining the location of a first region and data defining the location of said conducting interconnect patterns on said (i+1)th and (i−1)th layers, said first region being equal to a dummy pattern region where said dummy pattern should be defined minus a region where said conducting interconnect pattern is formed on said ith layer, said second data reflecting a logical AND of data defining the location of a second region and said data defining the location of said conducting interconnect pattern on said (i+1)th layer, said second region being equal to said dummy pattern region minus a region defined by said first data, said third data reflecting a logical AND of data defining the location of a third region and said data defining the location of said conducting interconnect pattern on said (i−1)th layer, said third region being equal to said dummy pattern region minus regions defined by said first and second data, said fourth region being equal to said dummy region minus regions defined by said first, second, and third data.

3. A method for forming a dummy pattern as set forth in claim 1, wherein said data defining the location of said dummy pattern on said ith layer is created by subtracting first, second, and third data from data defining the location of a dummy pattern region which is equal to a dummy pattern region where said dummy pattern should be defined separate from a region where a conducting interconnect pattern is formed on said ith region, said first data reflecting a logical AND of data defining the location of said dummy pattern region and data defining the location of said conducting interconnect patterns on said (i+1)th and (i−1)th layers, said second data reflecting a logical AND of data defining the location of a second region and data defining the location of said conducting interconnect pattern on said (i+1)th layer, said second region being equal to said dummy pattern region minus a region defined by said first data, said third data reflecting a logical AND of data defining the location of a third region and data defining the location of said conducting interconnect pattern on said (i−1)th layer, said third region being equal to said dummy pattern region minus regions defined by said first and second data.

4. A method for forming a dummy pattern on a semiconductor device having plural patterned layers of metallization, where n is the number of layers, said method comprising the steps of:

creating data about a dummy pattern on an ith layer (where i is an integer and satisfies a region given by ($1 \leq i < n-1$), using data defining the location of contact regions of (i+2)th through nth layers, when said dummy pattern on said ith layer should be formed; and forming this dummy pattern, based on said data defining the location of the dummy pattern on said ith layer.

5. A method for forming a dummy pattern on a semiconductor device as set forth in claim 4, wherein (A) first data defines a first region that is larger than a second region by a first predetermined amount, said second region being defined by a logical AND of data about said contact regions of (i+2)th through nth layers, (B) second data defines a third region that is larger by a second predetermined amount than a fourth region in said ith layer, (C) third data which is obtained by subtracting said second data from said first data defines a fifth region, and (D) said data defining the location of said dummy pattern on said ith layer is fourth data which reduces a part of the area of said fifth region by a third predetermined amount and enlarges the area of a remaining part by said third predetermined amount, said first, second and third predetermined amounts establishing the spacing between said dummy pattern and said fourth region.

6. A method for forming a dummy pattern on a semiconductor device as set forth in claim 5, wherein (A) said first predetermined amount is so set as to exceed an aligning accuracy of a stepper, (B) said second predetermined amount is set larger than one of a minimum possible linewidth and a minimum conductive interconnect spacing taking account of parasitic capacitance and less than a maximum conductive interconnect spacing that permits flattening, and (C) said third predetermined amount is set larger than half of said minimum possible linewidth.

7. A method for forming a dummy pattern in a semiconductor device having interconnect patterns on plural patterned layers of metallization, when n is the number of layers, said method comprising the steps of:

creating data defining the location of a dummy pattern on an ith layer (where i is an integer and satisfies a relation given by ($1 \leq i < n$), using data defining the location of a conducting interconnect pattern and a dummy pattern on an (i+1)th layer, when said dummy pattern should be formed on said ith layer;

forming this dummy pattern, based on said data about the dummy pattern on said ith layer; and forming a conducting interconnect pattern or a dummy pattern on said ith layer in an area wider than an area in which said conducting interconnect pattern or dummy pattern is formed on said (i+1)th layer.

8. A method for forming a dummy pattern in a semiconductor device having plural patterned layers of metallization when n is the number of layers, said method comprising the steps of:

preparing data defining the location of a two-dimensional array of islands each consisting of an assemblage of separated polygons when a dummy pattern should be formed on an ith layer (where i is an integer and satisfies a relation given by $(1 \leq i \leq n)$;

creating data defining the location of said dummy pattern on said ith layer by performing logical operations on a feature represented by said islands and on a pattern of conductive interconnects on said ith layer;

creating data defining the location of this dummy pattern, based on the created data; and wherein each of said polygons is a square having sides of a length L corresponding to a characteristic of a pattern of the conductive interconnects, and wherein a spacing S between adjacent ones of said islands is so set as to satisfy a relation given by $2L<S$.

* * * * *